(12) United States Patent
Lim

(10) Patent No.: US 6,252,416 B1
(45) Date of Patent: Jun. 26, 2001

(54) SEMICONDUCTOR TEST SYSTEM

(75) Inventor: Sang-Gyu Lim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/216,456

(22) Filed: Dec. 18, 1998

(30) Foreign Application Priority Data

Dec. 31, 1997 (KR) .................................................. 97-81011

(51) Int. Cl.$^7$ .................................................. G01R 31/28
(52) U.S. Cl. ........................ 324/765; 324/158.1; 714/735
(58) Field of Search .................................. 324/765, 73.1, 324/158.1; 714/735, 736, 767

(56) References Cited

U.S. PATENT DOCUMENTS

| | | | |
|---|---|---|---|
| 5,065,091 | * | 11/1991 | Tobita .................................. 324/73.1 |
| 5,146,161 | * | 9/1992 | Kiser .................................. 324/158.1 |
| 5,608,337 | * | 3/1997 | Hendricks et al. .................. 324/765 |

* cited by examiner

Primary Examiner—Safet Metjahic
Assistant Examiner—Jimmy Nguyen
(74) Attorney, Agent, or Firm—Myers Bigel Sibley & Sajovec

(57) ABSTRACT

A semiconductor test system for testing a semiconductor device, comprises a plurality of pins mounted in the semiconductor device to pass electrical signals, and a test equipment for generating a plurality of different test signals to test the semiconductor device based on the signals generated from the semiconductor device in response to the test signals, wherein at least two of the different signals are simultaneously supplied to one of the pins. The two different signals serve as a noise signal to the semiconductor device.

9 Claims, 6 Drawing Sheets

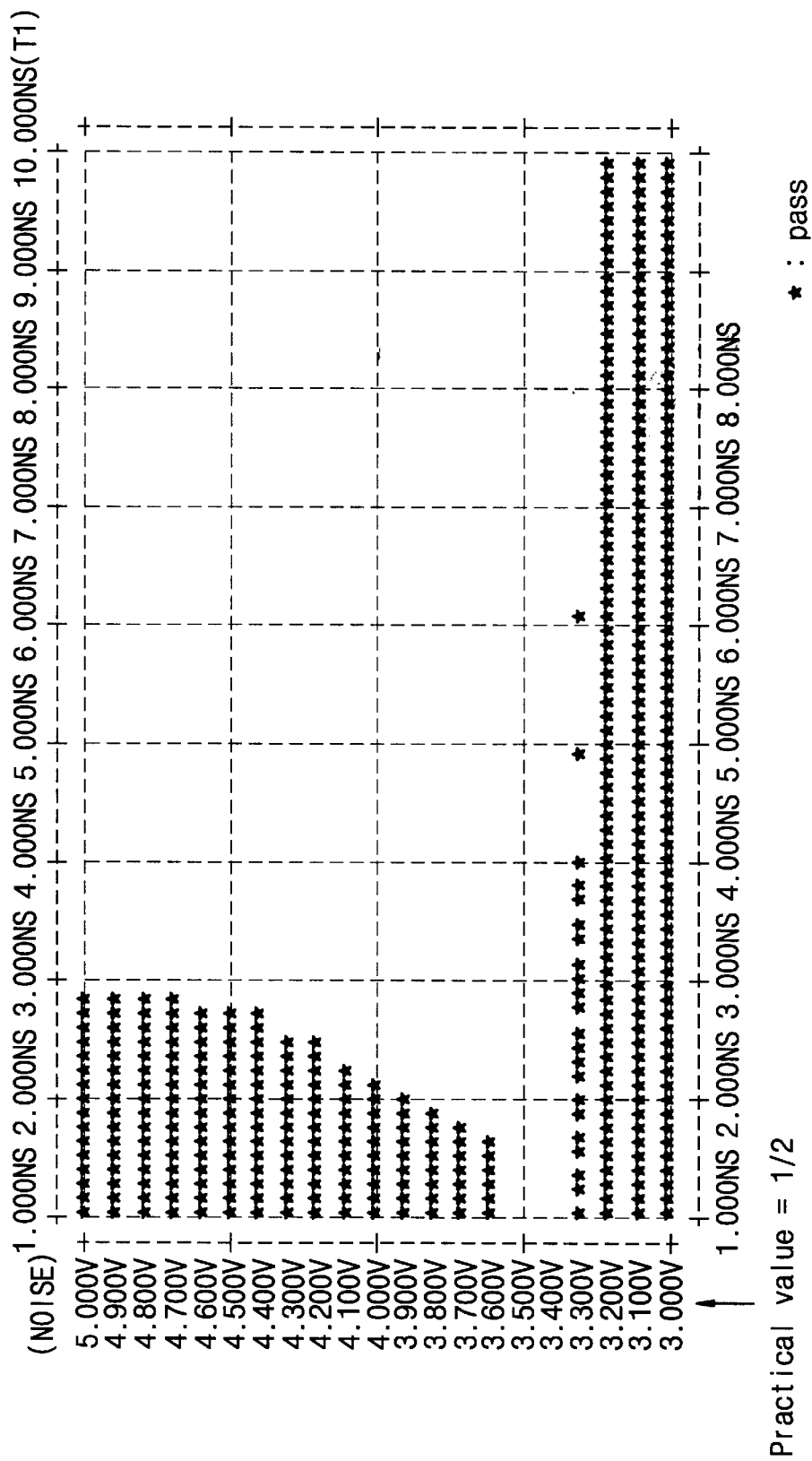

SEMICONDUCTOR TEST SYSTEM

FIELD OF THE INVENTION

The present invention concerns a semiconductor test system for testing a semiconductor device.

BACKGROUND OF THE INVENTION

FIG. 1 schematically shows a distorted signal including hump and undershoot noises. Semiconductor devices such as dynamic random access memory (DRAM) are assembled as modules in an electronic system, where a signal may be distorted by hump or undershoot noises caused by impedance mismatching or asymmetric line (difference of trace length) in the practical environment. The semiconductor device may malfunction by a distorted signal containing hump or undershoot noises. For example, if hump noises enter a row address strobe signal RAS' that is a master signal of DRAM, multiple word lines may be selected or the refresh counter may malfunction to fail the refresh operation of a certain cell. Moreover, the column address strobe CAS' may be precharged before or after precharging the row address strobe RAS', which may cause a word line glitch due to activation of the address by the hump noises, and other problems. The hump signal may also affect the column address strobe CAS' to result in malfunction of the device, as the distorted row address strobe RAS'. Moreover, the initially generated undershoot may cause a secondary undershoot resulting in inadvertent operation of the semiconductor device.

SUMMARY OF THE INVENTION

It is an object of the present invention to provide a semiconductor test system having means for supplying a tested semiconductor with a possible noise signal occurring during use in a practical environment.

According to an embodiment of the present invention, a semiconductor test system for testing a semiconductor device, comprises a plurality of pins mounted in the semiconductor device to pass electrical signals, and a test equipment for generating a plurality of different test signals to test the semiconductor device based on the signals generated from the semiconductor device in response to the test signals, wherein at least two of the different signals are simultaneously supplied to one of the pins. The two different signals serve as a noise signal to the semiconductor device.

The present invention will now described more specifically with reference to the drawings attached only by way of examples.

BRIEF DESCRIPTION OF THE ATTACHED DRAWINGS

FIGS. 5A and 5B are graphs for illustrating the pass/fail tendency of a semiconductor device according to the levels and durations of the noises.

DETAILED DESCRIPTION OF THE PREFERRED EMBODIMENTS

Figure 1:
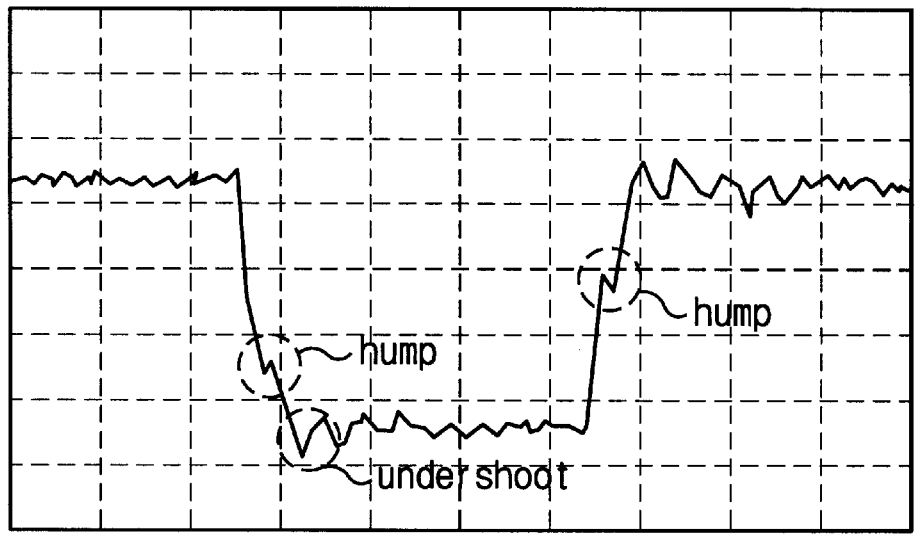
FIG. 1 is a graph for schematically showing a distorted signal including hump and undershoot noises.
Figure 2:
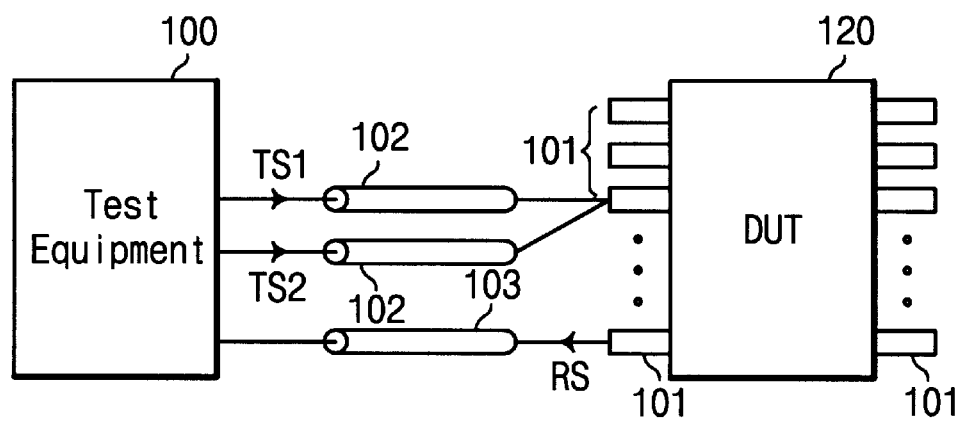
FIG. 2 is a block diagram for illustrating a semiconductor test system according to the present invention.
Figure 3:
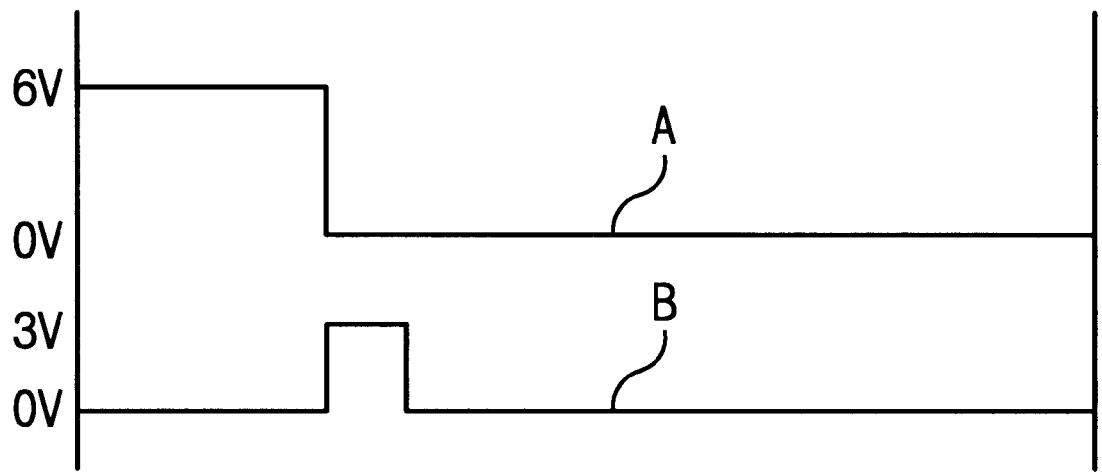
FIG. 3 is a graph for illustrating the characteristics of the signal C obtained by superimposing two different signals A and B.
Figure 3:
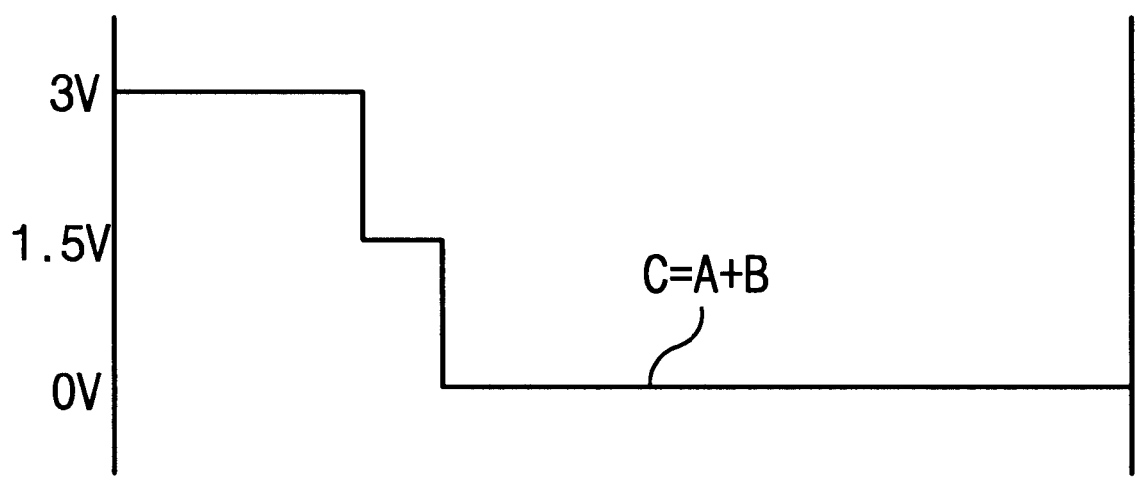
Figure 4:
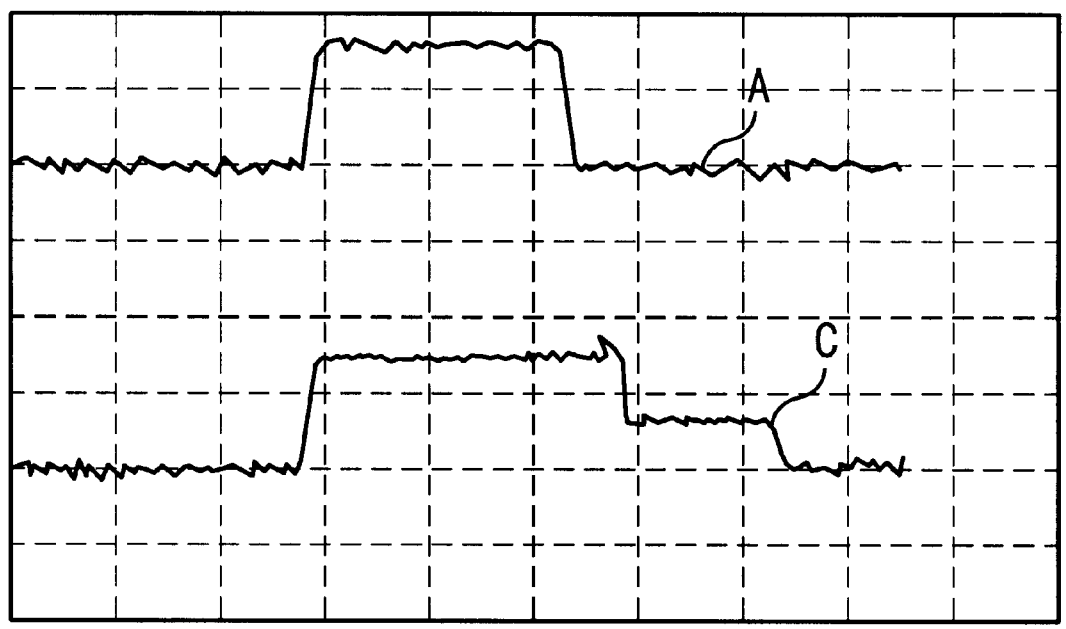
FIG. 4 is a graph for illustrating the waveform of the signal C of FIG. 3 obtained by using an oscilloscope.
Figure 5A:
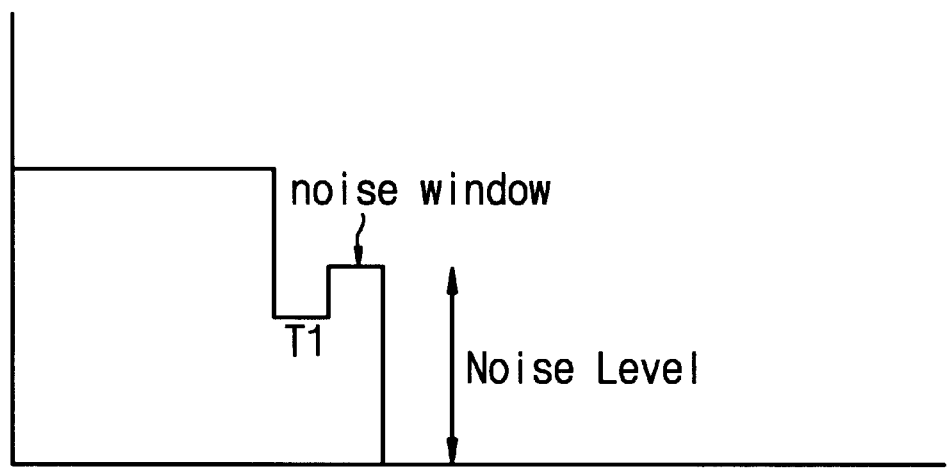
Figure 5A:
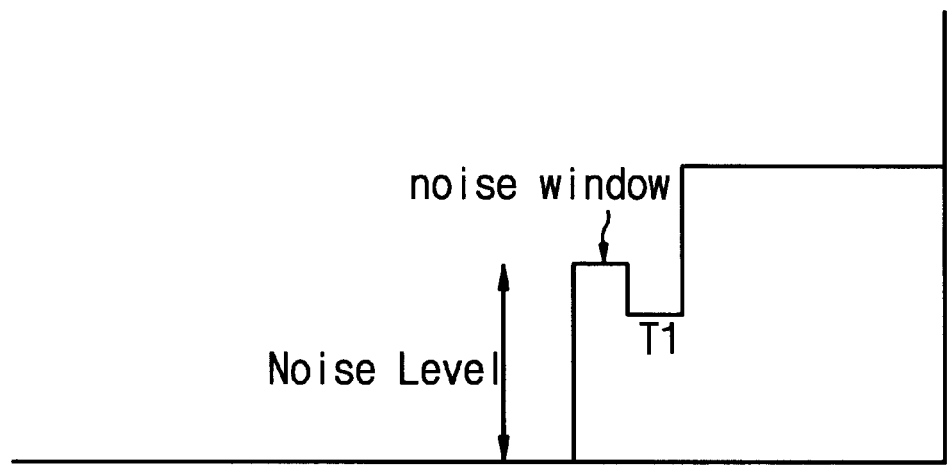
Figure 6:
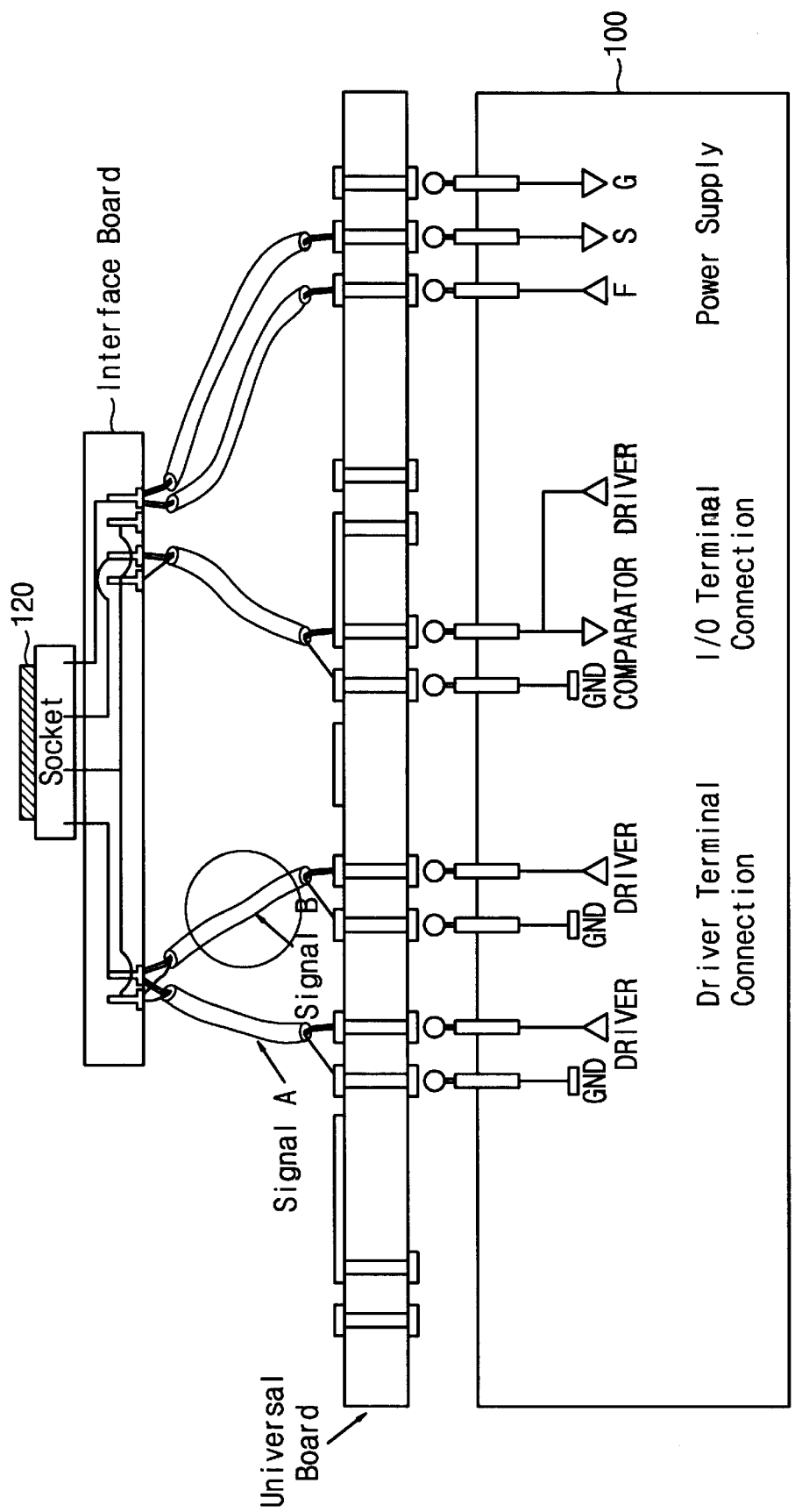
FIG. 6 is a graph for illustrating the practical environment of the semiconductor test system.

As shown in FIG. 2, the inventive semiconductor test system supplies at least two different test signals to one of the multiple signal pins of a semiconductor device, in order to produce the noises that may occur under the practical environment. The test equipment 100 generates a plurality of different test signals to test the semiconductor device 120 based on the signal RS received from the semiconductor device 120 through a signal line 103 in response to the test signals. Two different signals TS1 and TS2 of the test equipment 120 are simultaneously supplied through two signal lines 102 to one of the pins 101. The two different signals serve to generate a distorted signal including humps and undershoots that may occur under the practical environment. For example, as shown in FIG. 3, two signals A and B are simultaneously supplied through the two signal lines 102 to a single pin 101 of the semiconductor device 120 to produce the superimposed signal C whose level is half the sum of the levels of the two signals A and B. Hence, the levels of the two signals A and B should be determined according to the level of the intended signal C. FIG. 4 shows the superimposed signal generated by an oscilloscope. FIGS. 5A and 5B are graphs for illustrating the pass/fail tendency of a semiconductor device according to the levels and durations of the noises, and FIG. 6 is a graph for illustrating the practical environment of the semiconductor test system.

Generally, the signals supplied from the test equipment are adapted to specific cycles such as write, read CBR (CAS before RAS), ROR (RAS only Refresh), page mode, EDO (Extended Data Output) mode, etc. This can not provide a distorted signal including hump and undershoot that may occur under the practical environment. However, the inventive semiconductor test system provides the distorted signals of DRAM such as row address signal RAS', column address signal CAS', etc. including the hump and undershoot noises that may occur under the practical environment. Consequently, the inventive test system provides means for testing a semiconductor device subjected to the distorted signal that may occur under the practical environment.

While the present invention has been described in connection with specific embodiments accompanying the attached drawings, it will be readily appreciated by those skilled in the art that various changes and modifications may be made without departing the gist of the present invention.

What is claimed is:

1. A semiconductor test system for testing a semiconductor device, comprising:

a plurality of pins of said semiconductor device configured to conduct electrical signals to and from the semiconductor device;

a tester that provides a plurality of input test signals to said plurality of pins, wherein at least two of said plurality of input test signals are simultaneously provided to one of said plurality of pins to provide a superimposed input test signal at the one of said plurality of pins; and wherein the at least two of said plurality of input test signals comprise a first input test signal having a first voltage level and a second input test signal having a second voltage level, the first and second input test signals being superimposed to form a third input test signal having a third voltage level 0.

2. A semiconductor test system according to claim 1, wherein a first one of said at least two of said plurality of input test signals comprises a test noise signal to be superimposed with a second one of said at least two of said plurality of input test signals.

3. A semiconductor test system according to claim 1, wherein the third voltage level is less than the sum of the first and second voltage levels.

4. A semiconductor test system according to claim 1, wherein the third voltage level is about one half of the sum of the first and second voltage levels.

5. A semiconductor test system comprising:

a test signal generator that generates components of at least one of a plurality of test signals;

a first conductor, electrically coupled to the test signal generator, the first conductor being configured to conduct a first one of the components of the at least one of the plurality of test signals at a first time;

a second conductor, electrically coupled to the first conductor, the second conductor being configured to conduct a second one of the components of the at least one of the plurality of test signals at a second time, the first and second times being substantially simultaneous; and wherein the first one of the components has a first voltage level and the second one of the components has a second voltage level, wherein the first and second conductors are coupled to combine the first and second ones of the components to provide the at least one of the plurality of test signals having a third voltage level.

6. A semiconductor test system according to claim 5, wherein the third voltage level is less than a sum of the first and second voltage levels.

7. A semiconductor test system according to claim 5, wherein the third voltage level is about one half of a sum of the first and second voltage levels.

8. A semiconductor test system for testing a semiconductor device having a plurality of pins, the semiconductor test system comprising:

a test signal generator that generates a plurality of test signals;

a first signal line coupled to the test signal generator and configured to couple with a selected one of the pins of the semiconductor device;

a second signal line coupled to the test signal generator and configured to couple with the selected pin of the semiconductor device;

wherein the test signal generator simultaneously supplies first and second test signals respectively through the first and second signal lines to produce a superimposed signal at the selected pin of the semiconductor device; and wherein the first and second test signals comprise a first input test signal having a first voltage level and a second input test signal having a second voltage level, the first and second input test signals being superimposed to form a third input test signal having a third voltage level.

9. A semiconductor test system according to claim 8, wherein the first test signal comprises a test noise signal to be superimposed with the second test signal.

* * * * *